US012666643B2

(12) United States Patent
Li et al.

(10) Patent No.: US 12,666,643 B2
(45) Date of Patent: Jun. 23, 2026

(54) METHOD TO IMPLANT P-TYPE AND/OR N-TYPE RINGS IN A SEMICONDUCTOR DEVICE

(71) Applicant: Allegro MicroSystems, LLC, Manchester, NH (US)

(72) Inventors: Yu-Chun Li, New Taipei City (TW); Thomas S. Chung, Merrimack, NH (US); Maxim Klebanov, Palm Coast, FL (US); Chung C. Kuo, Manchester, NH (US); James M. McClay, Dudley, MA (US); Robert A. Wilson, Charlton, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 455 days.

(21) Appl. No.: 18/327,200

(22) Filed: Jun. 1, 2023

(65) Prior Publication Data

US 2024/0405124 A1     Dec. 5, 2024

(51) Int. Cl.
| | |
|---|---|
| *H10D 30/65* | (2025.01) |
| *H10D 30/01* | (2025.01) |
| *H10D 62/13* | (2025.01) |
| *H10D 64/00* | (2025.01) |
| *H10D 64/27* | (2025.01) |

(52) U.S. Cl.
CPC ......... H10D 30/65 (2025.01); H10D 30/0281 (2025.01); H10D 62/152 (2025.01); H10D 64/112 (2025.01); H10D 64/117 (2025.01); H10D 64/513 (2025.01)

(58) Field of Classification Search
CPC .. H10D 30/65; H10D 30/0281; H10D 62/152; H10D 64/513; H10D 30/0297; H10D 30/668; H10D 62/393; H10D 64/111–117; H10D 64/112; H10D 62/156
See application file for complete search history.

(56) References Cited

U.S. PATENT DOCUMENTS

| | | | | |
|---|---|---|---|---|
| 4,290,078 A * | 9/1981 | Ronen | ............ | H10B 20/00 |
| | | | | 257/E29.12 |
| 6,137,140 A * | 10/2000 | Efland | ............ | H10D 18/251 |
| | | | | 257/E27.03 |
| 6,309,929 B1 * | 10/2001 | Hsu | ............ | H10D 62/104 |
| | | | | 257/E21.384 |
| 6,396,090 B1 * | 5/2002 | Hsu | ............ | H10D 8/60 |
| | | | | 257/520 |
| 6,965,146 B1 * | 11/2005 | Wu | ............ | H10D 30/66 |
| | | | | 257/341 |

(Continued)

*Primary Examiner* — Maliheh Malek
(74) *Attorney, Agent, or Firm* — Daly, Crowley, Mofford & Durkee, LLP

(57) ABSTRACT

According to one aspect of the present disclosure, a semiconductor device includes a substrate having a first type dopant. In some embodiments, the semiconductor device also includes an epitaxial layer above the substrate, having a second type dopant and a top region. In some embodiments, the semiconductor device also includes a trench in the top region of the epitaxial layer; at least one doped ring implanted in the epitaxial layer below the trench; and a dielectric material filling within the trench. In some embodiments, there is a twelve-sided body tie in the epitaxial layer, wherein the sides of the twelve-sided body tie are not all equal to each other.

21 Claims, 13 Drawing Sheets

(56) References Cited

U.S. PATENT DOCUMENTS

| | | | | |
|---|---|---|---|---|
| 6,979,875 | B2 * | 12/2005 | Kwon | H10D 62/111 |
| | | | | 257/E29.066 |
| 6,992,353 | B1 * | 1/2006 | Wu | H10D 30/0293 |
| | | | | 257/341 |
| 7,224,025 | B2 * | 5/2007 | Tsai | H10D 30/603 |
| | | | | 257/E29.268 |
| 7,414,268 | B2 * | 8/2008 | Ryu | H10D 12/441 |
| | | | | 257/E29.198 |
| 7,800,185 | B2 * | 9/2010 | Hshieh | H10D 64/519 |
| | | | | 257/E21.418 |
| 7,960,222 | B1 * | 6/2011 | Kwon | H10D 30/65 |
| | | | | 438/341 |
| 7,977,715 | B2 * | 7/2011 | Cai | H10D 84/83 |
| | | | | 257/337 |
| 8,053,808 | B2 * | 11/2011 | Su | H10D 30/665 |
| | | | | 438/141 |
| 8,575,707 | B2 * | 11/2013 | Tamaki | H10D 30/665 |
| | | | | 257/341 |
| 8,928,077 | B2 * | 1/2015 | Lee | H10D 30/0291 |
| | | | | 257/341 |
| 8,969,968 | B2 * | 3/2015 | Ma | H10D 89/921 |
| | | | | 257/356 |
| 9,136,323 | B2 * | 9/2015 | Yang | H10D 30/0221 |
| 9,166,039 | B2 * | 10/2015 | Landgraf | H10D 30/65 |
| 9,306,060 | B1 * | 4/2016 | Yang | H10D 30/655 |
| 9,490,322 | B2 * | 11/2016 | Yang | H10D 62/126 |
| 9,673,187 | B2 * | 6/2017 | Salcedo | H10D 89/713 |
| 9,698,258 | B2 * | 7/2017 | Ryu | H10D 30/65 |
| 9,755,067 | B2 * | 9/2017 | Lim | H10D 30/65 |
| 9,761,707 | B1 * | 9/2017 | Lin | H10D 84/811 |
| 9,831,233 | B2 * | 11/2017 | Salcedo | H10D 89/713 |
| 9,871,135 | B2 * | 1/2018 | Lin | H10D 62/127 |
| 9,905,687 | B1 * | 2/2018 | Zhu | H10D 62/151 |
| 9,941,350 | B1 * | 4/2018 | Lin | H10D 62/111 |
| 10,153,366 | B2 * | 12/2018 | Chung | H10D 30/65 |
| 10,438,941 | B2 * | 10/2019 | Tsai | H10D 62/126 |
| 11,322,492 | B2 * | 5/2022 | Shin | H10D 30/603 |
| 11,362,197 | B2 * | 6/2022 | Shin | H10D 30/028 |
| 12,249,646 | B2 * | 3/2025 | Chung | H10D 62/111 |
| 2002/0045295 | A1 * | 4/2002 | Hiraga | H10W 42/00 |
| | | | | 257/E29.013 |
| 2002/0167071 | A1 * | 11/2002 | Wang | H10W 42/00 |
| | | | | 257/620 |
| 2003/0038316 | A1 * | 2/2003 | Tsuchiko | H10D 30/65 |
| | | | | 257/E29.066 |
| 2003/0218188 | A1 * | 11/2003 | Jeon | H10D 30/65 |
| | | | | 257/E21.537 |
| 2008/0054994 | A1 * | 3/2008 | Shibib | H10D 30/603 |
| | | | | 257/E29.264 |
| 2008/0277669 | A1 * | 11/2008 | Okuno | H10D 62/8325 |
| | | | | 257/77 |
| 2012/0211832 | A1 * | 8/2012 | Chu | H10D 64/111 |
| | | | | 257/E29.261 |
| 2012/0248499 | A1 * | 10/2012 | Kusunoki | H10D 12/461 |
| | | | | 257/E27.06 |
| 2012/0292698 | A1 * | 11/2012 | Moon | H10D 30/603 |
| | | | | 438/286 |
| 2013/0075816 | A1 * | 3/2013 | Yoo | H10D 62/106 |
| | | | | 438/286 |
| 2014/0124857 | A1 * | 5/2014 | Jang | H10D 30/65 |
| | | | | 257/337 |
| 2014/0183639 | A1 * | 7/2014 | Ma | H10D 89/921 |
| | | | | 257/487 |
| 2015/0102405 | A1 * | 4/2015 | Ryu | H10D 30/0281 |
| | | | | 438/286 |
| 2015/0179793 | A1 * | 6/2015 | Denison | H10D 62/111 |
| | | | | 438/286 |
| 2015/0243770 | A1 * | 8/2015 | Hebert | H10D 10/40 |
| | | | | 257/586 |
| 2015/0243781 | A1 * | 8/2015 | Min | H10D 30/655 |
| | | | | 257/339 |
| 2016/0240660 | A1 * | 8/2016 | Yue | H10D 30/655 |
| 2016/0300904 | A1 * | 10/2016 | Antoniou | H10D 12/481 |
| 2017/0077219 | A1 * | 3/2017 | Yang | H10D 62/111 |
| 2017/0263759 | A1 * | 9/2017 | Chung | H10D 30/65 |
| 2017/0287894 | A1 * | 10/2017 | Kuo | H10D 89/611 |
| 2019/0049529 | A1 * | 2/2019 | Cesaretti | H10N 52/01 |
| 2019/0131412 | A1 * | 5/2019 | Ozaki | H10D 62/105 |
| 2019/0259829 | A1 * | 8/2019 | Mun | H10D 64/258 |
| 2020/0243513 | A1 * | 7/2020 | Schöner | H10D 84/01 |
| 2020/0328275 | A1 * | 10/2020 | Lin | H10D 62/157 |
| 2021/0028166 | A1 * | 1/2021 | Shin | H10D 30/603 |
| 2021/0028298 | A1 * | 1/2021 | Shin | H10D 62/116 |
| 2021/0104630 | A1 * | 4/2021 | Chung | H10D 30/603 |
| 2021/0118987 | A1 * | 4/2021 | Yao | H10D 62/111 |
| 2023/0170383 | A1 * | 6/2023 | Kim | H10D 30/665 |
| | | | | 257/494 |
| 2024/0055516 | A1 * | 2/2024 | Wang | H10D 30/603 |
| 2024/0063310 | A1 * | 2/2024 | Li | H10D 62/106 |
| 2024/0429315 | A1 * | 12/2024 | Lee | H10D 30/668 |
| 2025/0194134 | A1 * | 6/2025 | Moore | H10D 30/0297 |
| 2025/0228054 | A1 * | 7/2025 | Lin | H10H 20/8312 |

* cited by examiner

METHOD TO IMPLANT P-TYPE AND/OR N-TYPE RINGS IN A SEMICONDUCTOR DEVICE

BACKGROUND

A double-diffused metal oxide semiconductor (DMOS) transistor is a type of power transistor commonly used in high voltage applications. A DMOS-transistor has a lightly-doped drain region that carries the current flow between the source and the drain. DMOS transistors can be formed as vertical or lateral devices, wherein the source and drain regions may be spaced apart vertically or laterally.

In some embodiments, a DMOS structure is formed by layering an n-type buried layer (NBL) on top of a p-type substrate. A p-type buried layer (PBL) is on top of the NBL. An n-type epitaxial layer is formed on top of the substrate, the NBL, and the PBL. A shallow trench isolation (STI) structure is formed by etching the epitaxial layer between the gate channel and the drain. The STI structure increases the breakdown voltage. After the STI is formed, a p-type doped region is implanted in the n-epitaxial layer to form the well region at the source side of the device. A n-type doped region and a p-type doped region are implanted to form the drain side drift region. A gate oxide is grown and the gate structure is formed.

There are two different types of body contact structures, body-tie type and non-body tie type, that can be implemented, depending on the desired application. The body-tie type has n-type and p-type doped regions adjacent to each other on the top of the p-type doped well region. The non-body tie type has n-type and p-type doped regions separated by a STI region. Two n-type doped regions are positioned the p-type doped well region and n-type doped drift region to form source and drain contacts.

SUMMARY

According to one aspect of the present disclosure, a semiconductor device includes a substrate having a first type dopant. In some embodiments, the semiconductor device also includes an epitaxial layer above the substrate, having a second type dopant and a top region. In some embodiments, the semiconductor device also includes a trench in the top region of the epitaxial layer; at least one doped ring implanted in the epitaxial layer below the trench; and a dielectric material filling within the trench.

According to another aspect of the present disclosure, a semiconductor device includes a substrate having a first type dopant. In some embodiments, the semiconductor device also includes an epitaxial layer above the substrate, having a second type dopant and a top region. In some embodiments, the semiconductor device also includes a twelve-sided body tie in the epitaxial layer, wherein sides of the twelve-sided body tie are not all equal to each other. In some embodiments, the semiconductor device also includes a trench in the top region of the epitaxial layer; at least one doped ring implanted in the epitaxial layer below the trench; a dielectric material filling within the trench; and an oxide and a gate structure on the dielectric material.

According to another aspect of the present disclosure, a method includes depositing an epitaxial layer doped with a second type dopant on a substrate doped with a first type dopant. In some embodiments, the method also includes etching the epitaxial layer to form a trench; implanting at least one doped ring through the trench and into the epitaxial layer; and filling the trench with a dielectric material.

According to another aspect of the present disclosure, a semiconductor device includes a substrate having a first type dopant. In some embodiments, the semiconductor device also includes an epitaxial layer above the substrate, having a second type dopant and a top region. In some embodiments, the semiconductor device also includes a twelve-sided body tie in the epitaxial layer, wherein sides of the twelve-sided body tie are not all equal to each other. In some embodiments, the semiconductor device also includes a dielectric material filling and an oxide and a gate structure on top of the epitaxial layer.

DESCRIPTION OF THE SEVERAL VIEWS OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIGS. 1b to 1d are cross sections of examples of portions of the semiconductor device of FIG. 1a;

FIG. 11 is a top view of an example of the twelve-sided body tie in the semiconductor device of FIG. 1a.

DETAILED DESCRIPTION

Described herein are techniques to form one or more doped rings in a semiconductor device. In one example, a trench is formed (e.g., using etching) in a semiconductor layer (e.g., an epitaxial layer); the doped rings are implanted through the trench into the semiconductor layer; and after the doped rings are implanted, a dielectric is deposited to fill the trench. In one example, the dielectric in the filled trench is a Shallow Trench Isolation (STI) structure. In one example, the semiconductor device is a double-diffused metal oxide semiconductor (DMOS) transistor. In one example, the doped rings may enable an adjustment of the breakdown voltage and/or on-state resistance. In some examples, the semiconductor device may also include a twelve-sided body tie.

Figure 1A:
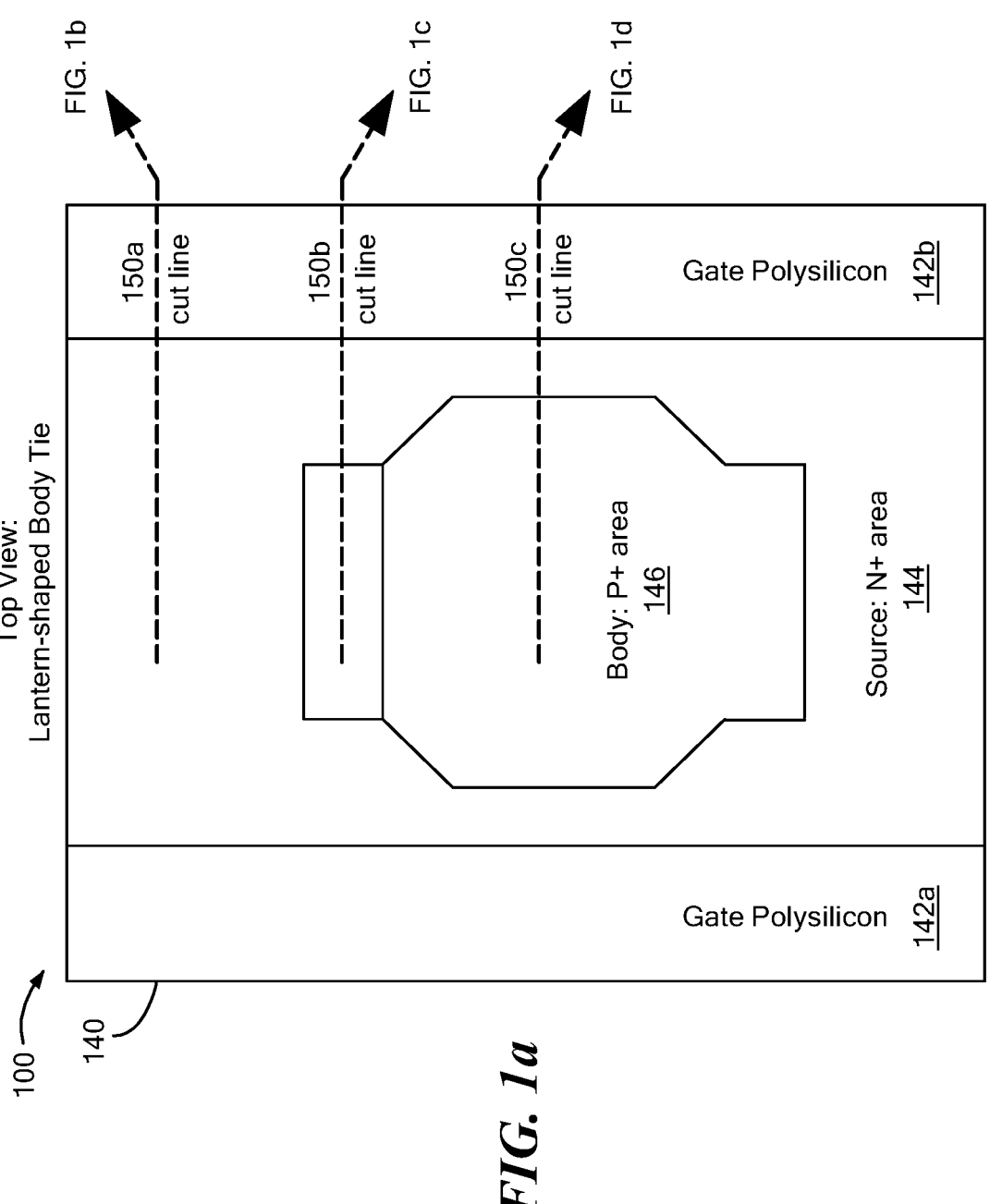
FIG. 1a is a top view of an example of a body tie in a semiconductor device.

Referring to FIG. 1a, a semiconductor device 100 depicts three cut lines 150a, 150b, 150c. The three cut lines 150a, 150b, 150c correspond to cross sectional views, shown in FIGS. 1b to 1d, of portions of the semiconductor device 100. In particular, a first cut line 150a corresponds to a first semiconductor device portion 110a. A second cut line 150b corresponds to a second semiconductor device portion 110b. A third cut line 150c corresponds to a third semiconductor device portion 110c.

The semiconductor device 100 includes a twelve-sided body tie 140 in a source region 144. Next to the source region 144 is a gate polysilicon 142a, 142b. A first gate polysilicon 142a is situated on one first side of the source region 144 and a second gate polysilicon 142b is situated on an opposing second side of the source region 144.

Figures 1B, 1C:
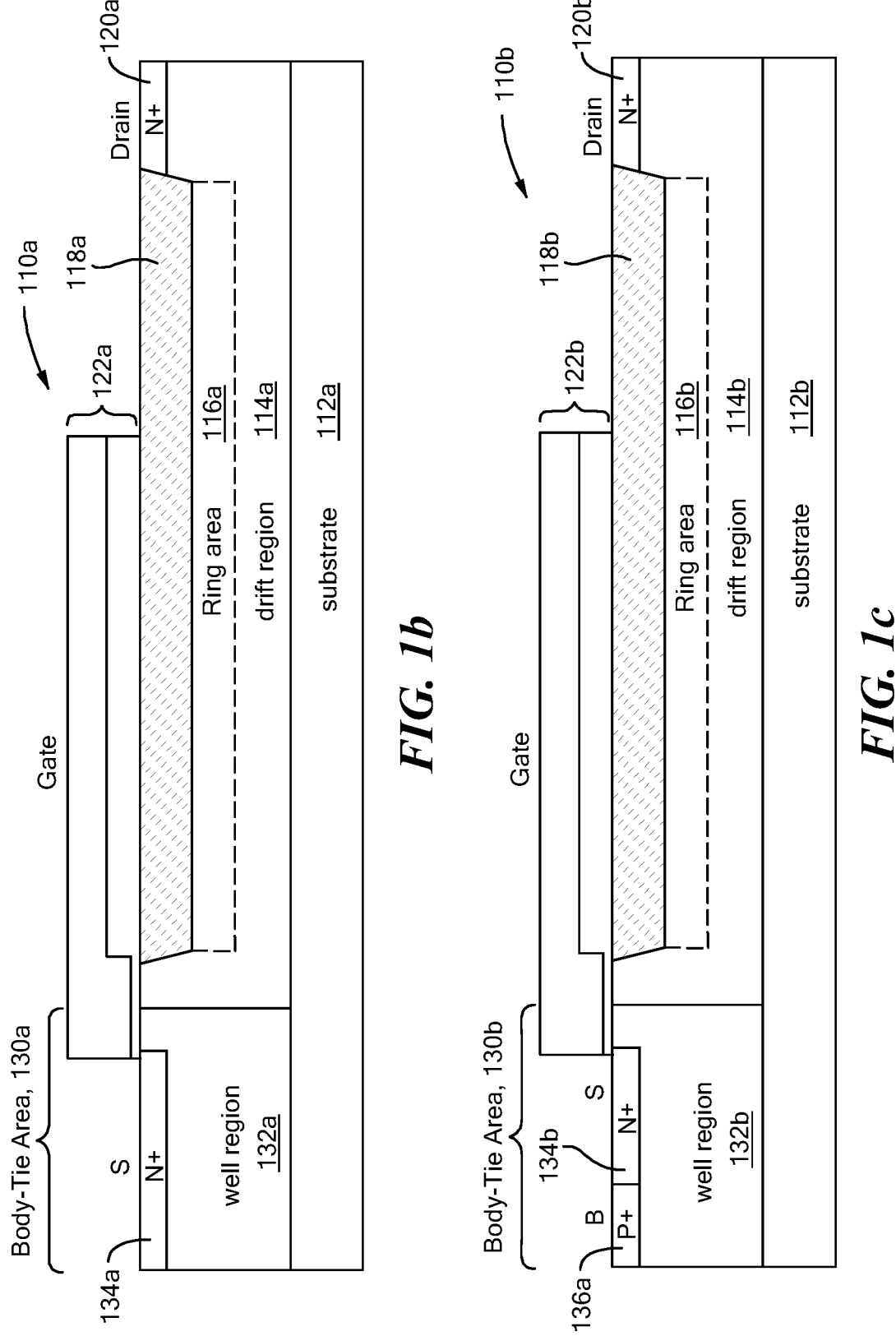

Referring to FIGS. 1b-1c, a substrate includes, for example, a substrate portion 112a, a substrate portion 112b and a substrate portion 112c. A drift region includes, for example, a drift region portion 114a, a drift region portion 114b and a drift region portion 114c. A ring area include a ring area portion 116a, a ring portion 116b and a ring portion 116c. A dielectric material includes a dielectric material portion 118a, a dielectric material portion 118b and a dielectric material portion 118c.

A drain region includes a drain region portion 120a, a drain portion 120b and a drain portion 120c. In one example, the drain region portions 120a, 120b, 120c may be heavily doped with an n-type dopant.

A gate structure includes a gate structure portion 122a, a gate structure portion 122b and a gate structure portion 122c. A body-tie area include a body-tie area portion 130a, a body-tie area portion 130b, and a body-tie area portion 130c.

A well region includes a well region portion 132a, a well region portion 132b and a well region portion 132c. In one example, the well region portions 132a, 132b, 132c may be doped with a p-type dopant and may also be referred to as a p well region.

A source region includes a source region portion 134a, a source region portion 134b a source region portion 134c. In one example, the source region portions 134a, 134b, 134c may be heavily doped with an n-type dopant.

A body region includes a body region portion 136a and a body region portion 136b. In one example, the body region portions 136a, 136b may be heavily doped with a p-type dopant.

Referring to FIG. 1b, the first semiconductor device portion 110a includes the substrate portion 112a. The drift region portion 114a and the well region portion 132a are formed on the substrate portion 112a. In the drift region portion 114a, there are one or more doped rings within the ring area portion 116a. The dielectric material portion 118a is on top of the ring area portion 116a.

The drain region portion 120a is formed on the drift region portion 114a and next to the dielectric material portion 118a. The well region portion 132a forms the base of the body tie area portion 130a. In an embodiment, the body tie area portion 130a includes the source region portion 134a. The gate region portion 122a is on top of the source region portion 134a, the dielectric material portion 118a and the well region portion 132a and the drift region portion 114a.

Referring to FIG. 1c, the second semiconductor device portion 110b includes the substrate portion 112b. The drift region portion 114b and the well region portion 132b are formed on the substrate portion 112b. In the drift region portion 114b, there are one or more doped rings within the ring area portion 116b. The dielectric material portion 118b is on top of the ring area portion 116b.

The drain region portion 120b is formed on the drift region portion 114b and next to the dielectric material portion 118b. The well region portion 132b forms the base of the body tie area portion 130b. In an embodiment, the body tie area portion 130b includes the source region portion 134b and the base region portion 136a. The gate structure portion 122b is on top of the source region portion 134b, the dielectric material portion 118b, the well region portion 132b, and the drift region 114b.

Figure 1D:
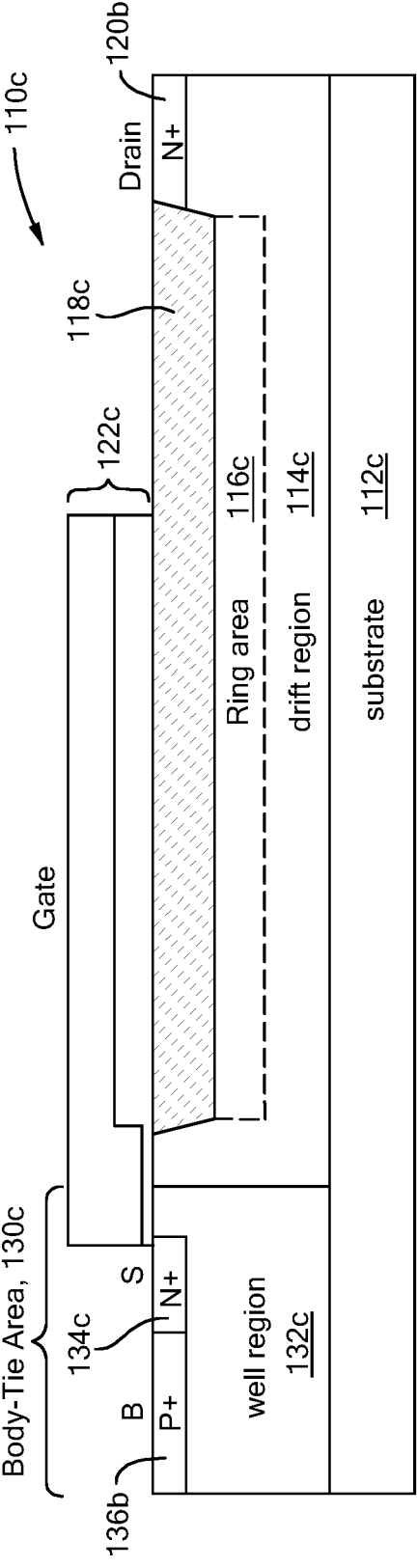

Referring to FIG. 1d, the third semiconductor device portion 110c includes the substrate portion 112c. The drift region portion 114c and the well region portion 132c are formed on the substrate portion 112c. In the drift region portion 114c, there are one or more doped rings within the ring area portion 116c. The dielectric material portion 118c is on top of the ring area portion 116c.

The drain region portion 120c is formed on the drift region portion 114c and next to the dielectric material portion 118c. The well region portion 132c forms the base of the body tie area portion 130c. In an embodiment, the body tie area portion 130b includes a source contact portion 134c and the body contact portion 136b. The gate contact portion 122c is on top of the source region portion 134c, the dielectric material portion 118c, the well region portion 132c, and the drift region 114c.

Figures 2, 3:
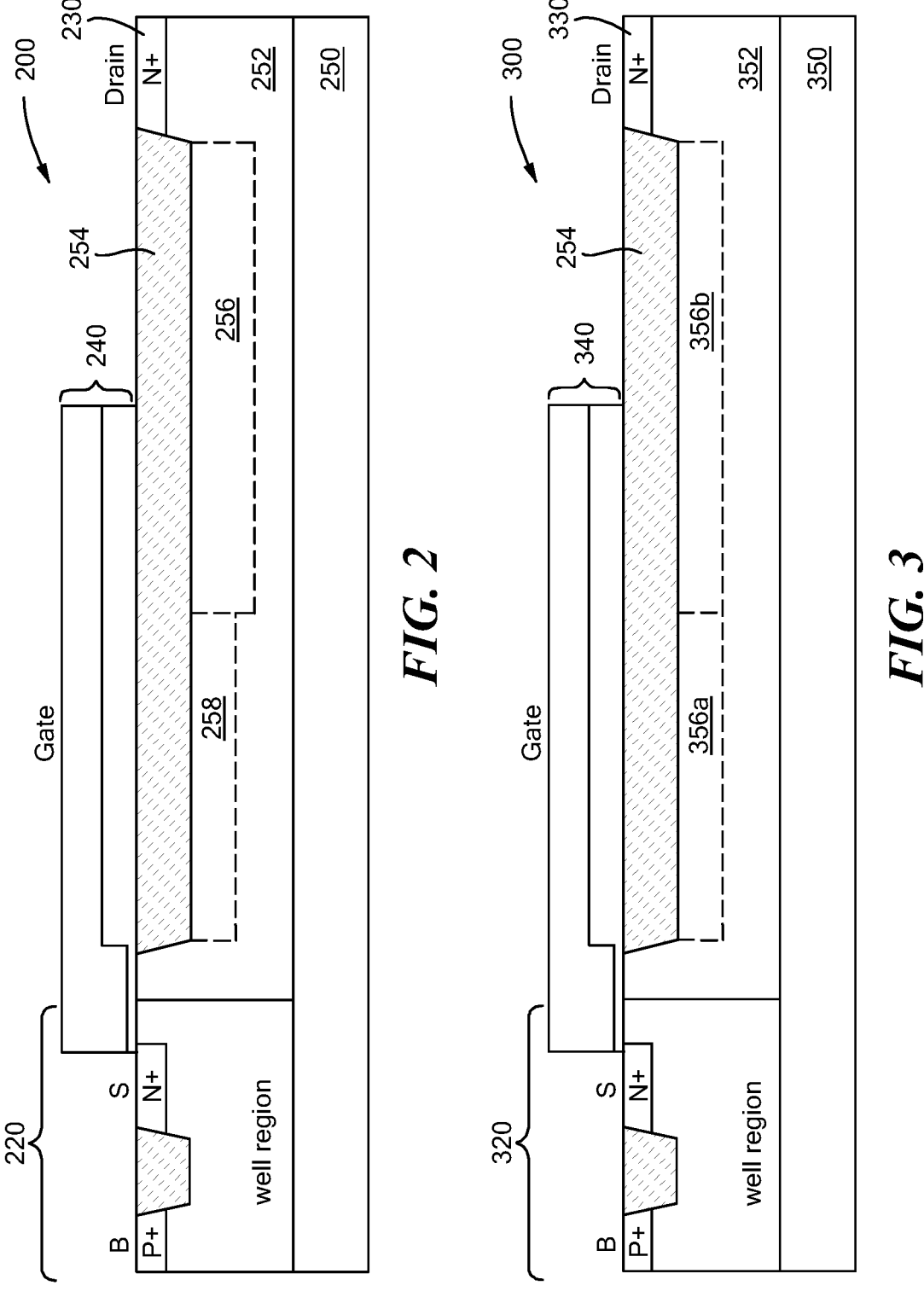
FIG. 2 is a cross-sectional view of an example of the semiconductor device of FIG. 1a with a p-type doped ring and an n-type doped ring.
FIG. 3 is a cross-sectional view of another example of the semiconductor device of FIG. 1a with p-type doped rings.

Referring to FIG. 2, an example of the semiconductor device 100 is a semiconductor device 200. The semiconductor device 200 includes an n-type doped ring 256, a p-type doped ring 258, a body tie region 220, a drain region 230, and a gate structure 240. The gate structure 240 is situated on top of the body tie region 220, a drift region 252, and a layer of dielectric material 254.

The drift region 252 and the body tie region 220 are formed on a substrate 250. The n-type doped ring 256 and the p-type doped ring 258 are implanted in the drift region 252. A layer of dielectric material 254 is deposited in the drift region 252 and the n-type doped ring 256 and the p-type doped ring 258. While FIG. 2 depicts an embodiment with one n-type doped ring 256 and one p-type doped ring 258 implanted, in alternative embodiments one or more n-type doped rings may be implanted and/or one or more p-type doped rings may be implanted.

There are a number of benefits to using the n-type doped ring 256 and the p-type doped ring 258. For example, the p-type doped ring 258 can reduce a high electric field. The p-type doped ring 258 increases the current flow resistance along the interface between the STI and the drift region 252. Further, the p-type doped ring 258 also can cover a portion of the STI next to the source side, where high electric field is induced due to the corner of the STI. In another example, the n-type doped ring 256 can reduce the on-state resistance The n-type doped ring 256 increases the free carrier density in the drift-region 252, following the on-state current is increased, which indicates the on-state resistance can be reduced. In a further example, sizes and depths of the n-type doped ring 256 and the p-type doped ring 258 may be adjustable. As used herein "depth" refers to a distance the n-type and/or p-type doped rings 256, 258 are implanted into the drift region 252. In one embodiment, the semiconductor device 200 is a DMOS transistor.

Referring to FIG. 3, another example of the semiconductor device 100 is a semiconductor device 300. The semiconductor device 300 includes p-type doped rings 356a, 356b, a body tie region 320, a drain region 330, and a gate structure 340. The gate structure 340 is situated on top of the body tie region 320, a drift region 352, and a layer of dielectric material 354.

The drift region 352 and the body tie region 320 are formed on a substrate 350. The p-type doped rings 356a, 356b are implanted in the drift region 352, with a first p-type doped ring 356a implanted next to a second p-type doped ring 356b. A layer of dielectric material 354 is deposited in the drift region 352 and on the p-type rings 356a, 356b. The size and depth for each of the p-type rings 356a, 356b can be adjusted individually. The p-type rings 356a, 356b can be placed increasingly deeper from the drain 330 to the body tie region 320 in order to gain a good balance between breakdown voltage and on-state resistance. A balance between breakdown voltage and on-state resistance can be obtained by optimizing the depth of each p-type ring. The deeper p-type doped rings close to the source side suppress the high electric field near the STI, thus increasing the breakdown voltage. The shallower p-type doped ring near the drain side cause the on-resistance to increase less. The p-type doped rings 356a, 356b can reduce the maximum electric field at the body tie region 320. The maximum electric field often occurs near the STI edge and corner. The p-type doped ring at the body side increases drift resistance, which helps reduce the electric field.

Figures 4, 5:
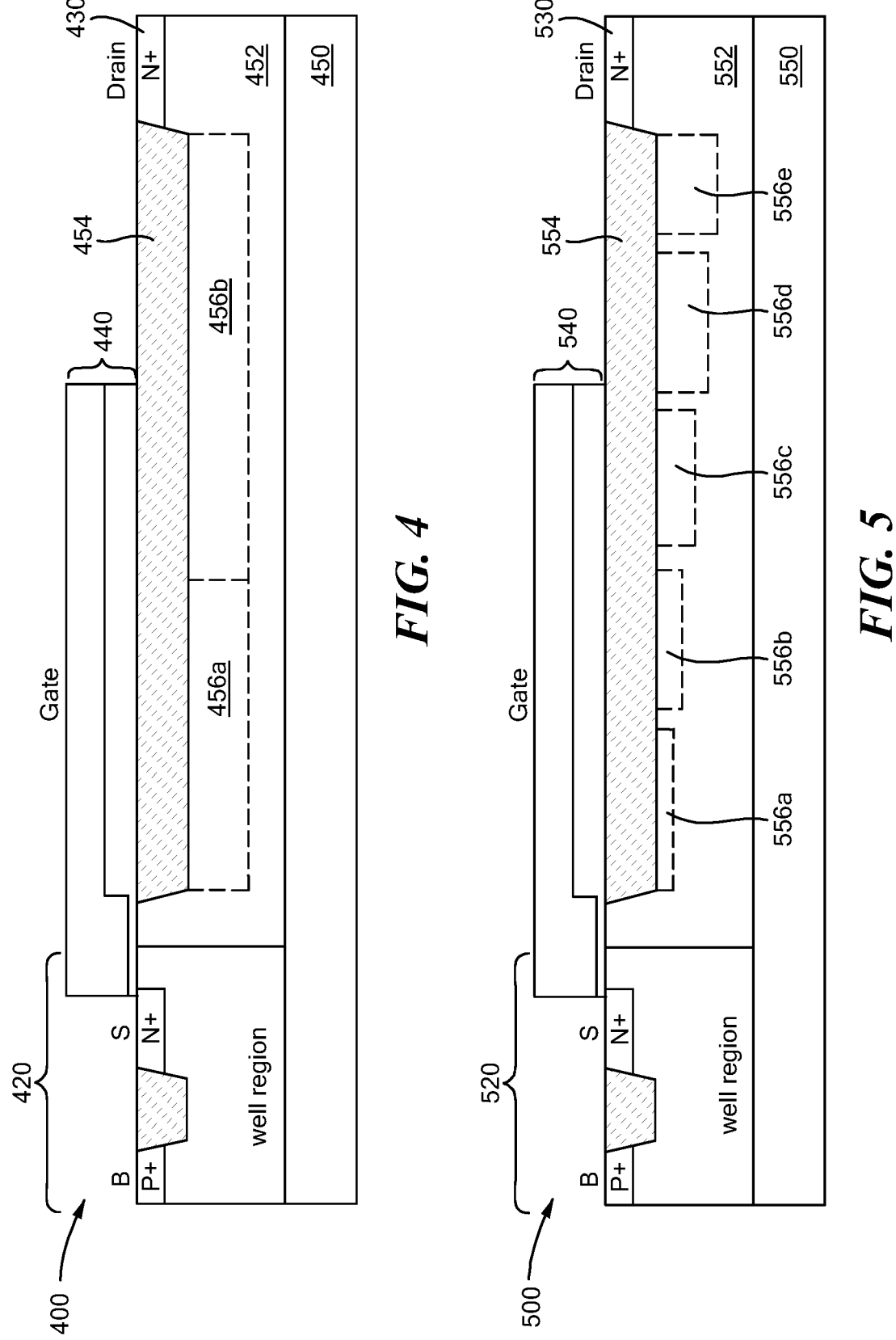
FIG. 4 is a cross-sectional view of a further example of the semiconductor device of FIG. 1a with n-type doped rings.
FIG. 5 is a cross-sectional view of a still further example of the semiconductor device of FIG. 1a with doped rings formed using different implantation energy levels.

Referring to FIG. 4, a further example of the semiconductor device 100 is a semiconductor device 400. The semiconductor device 400 includes n-type doped rings 456a, 456b, a body tie region 420, a drain region 430, and a gate 440. The gate 440 is situated on top of the body tie region 420, a drift region 452, and a layer of dielectric material 454.

The drift region 452 and the body tie region 420 are formed on a substrate 450. The n-type doped rings 456a, 456b are implanted in the drift region 452. A layer of dielectric material 454 is deposited on the n-type doped rings 456a, 456b.

While FIG. 4 depicts two n-type doped rings 456a, 456b implanted, in some embodiments one or more n-type doped rings may be implanted. The size and depth for each of the n-type doped rings 456a, 456b can be adjusted individually. These rings facilitate the conductivity of the on-state current. The n-type doped rings increase the doping concentration of the n-type doped drift region, causing more free carriers to distribute in the drift region, leading to higher conductivity. In an embodiment, such as the one depicted in FIG. 4, the two n-type doped rings 456a, 456b are positioned next to each other at the same depth, with a first n-type doped ring 456a implanted next to a second n-type doped ring 456b. In an alternate embodiment, the doped rings may be placed at an decreasingly deeper depth across the semiconductor device 400 from the drain 430 to the body tie region 420 such that the first n-type doped ring 456a may be at a shallower depth compared to a second n-type doped ring 456b. In such an embodiment, the n-type doped rings can be placed increasingly deeper from the body tie region 420 to the drain region 430 to gain a good balance between breakdown voltage and on-state resistance.

Referring to FIG. 5, a still further example of the semiconductor device 100 is a semiconductor device 500. The semiconductor device 500 includes doped rings 556a, 556b, 556c, 556d, 556e that are at the same energy level. The semiconductor device 500 includes a body tie region 520, a drain region 530, and a gate 540. The gate 540 is situated on top of the body tie region 520, a drift region 552, and a layer of dielectric material 554.

The drift region 552 and the body tie region 520 are formed on a substrate 550. The doped rings 556a, 556b, 556c, 556d, 556e are implanted into the drift region 552. In an embodiment, such as that depicted in FIG. 5, the doped rings 556a, 556b, 556c, 556d, 556e may be doped with an n-type dopant or a p-type dopant or a there may be a mix of rings doped with an n-type dopant or a p-type dopant. A layer of dielectric material 554 is deposited on the doped rings 556a, 556b, 556c, 556d, 556e.

The size and depth for each of the doped rings 556a, 556b, 556c, 556d, 556e can be adjusted individually. In an embodiment, such as that depicted in FIG. 5, a first doped ring 556a may be implanted at a higher depth than the other doped rings 556b, 556c, 556d, 556e. As used herein, the term "higher depth" refers to a doped ring that is implanted into the drift region 552 farther from the substrate 550 and closer to the layer of dielectric material 554.

A second doped ring 556b may be implanted at a lower depth than the first doped ring 556a, but a higher depth than doped rings 556c, 556c, 556d, 556e. A third doped ring 556c may be implanted at a lower depth than the first two doped rings 556a, 556b, but a higher depth than other doped rings 556c, 556d, 556e. As used herein, the term "lower depth" refers to a doped ring that is implanted into the drift region 552 closer to the substrate 550 and farther from the layer of dielectric material 554.

A fourth ring 556d may be implanted at a lower depth than the first three doped rings 556a, 556b, 556c, but a higher depth than a fifth doped ring 556e. A fifth doped ring 556e may be implanted at a lower depth than the other doped rings 556a, 556b, 556c, 556d.

The doped rings can be placed at an increasingly deeper depth across the semiconductor device 500 from the body tie region 520 to the drain 530 in order to gain a good balance between breakdown voltage and on-state resistance. The doped rings can facilitate the conductivity of the on-state current.

Figure 6:
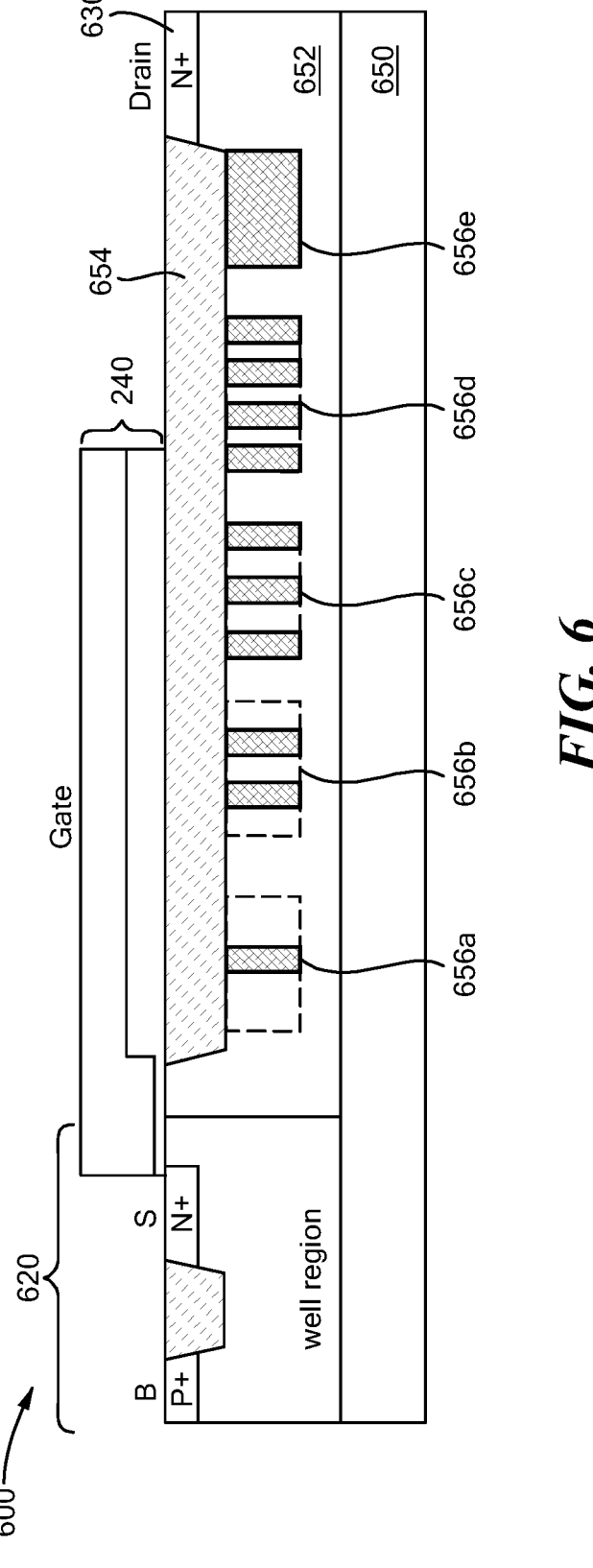
FIG. 6 is a cross-sectional view of another example of the semiconductor device of FIG. 1a with the doped rings formed using different implantation area sizes and with the same implantation energy level.

Referring to FIG. 6, another example of the semiconductor device 100 is a semiconductor device 600. The semiconductor device 600 includes doped rings 656a, 656b, 656c, 656c, 656d, 656e at the same energy level. The semiconductor device 600 includes a body tie region 620, a drain region 630, and a gate 640. The gate 640 is situated on top of the body tie region 620, a drift region 652, and a layer of dielectric material 654. A layer of dielectric material 654 is deposited on the drift region 652 and the doped rings 656a, 656b, 656c, 656c, 656d, 656e.

The drift region 652 and the body tie region 620 are formed on a substrate 650. The doped rings 656a, 656b, 656c, 656c, 656d, 656e are implanted in the drift region 652. In an embodiment, such as that depicted in FIG. 6, the doped rings 656a, 656b, 656c, 656c, 656d, 656e may be doped with an n-type dopant or a p-type dopant or the doped rings may include a mix of rings doped with an n-type dopant or a p-type dopant.

In order to adjust the energy level so that it is the same, the doped rings may be doped by different amounts and different energies, creating different densities for each ring. The amount of doping for each ring is adjustable individually. In an embodiment, such as that shown in FIG. 6, the doping densities are adjusted individually and increase incrementally. Following, the amount of doping may increase across the semiconductor device 600.

A first doped ring 656a is implanted with a first doping density that may have the lowest amount of doping density compared to the other doped rings 656b, 656c, 656c, 656d, 656e. A second doped ring 656b is implanted with a second doping density that may be higher than the amount of doping density in the first doped ring 656a, but less compared to the other doped rings 656c, 656c, 656d, 656e. The second doped ring 9656b may be implanted next to the first doped ring 656a and a third doped ring 656c. The third doped ring 656c is implanted with a third doping density that may be higher than the amount of doping density in the second doped ring 656b, but less compared to the other doped rings 656d, 656e. The third doped ring 656c may be implanted next to the second doped ring 656d and a fourth doped ring 656d. The fourth doped ring 656d is implanted with a fourth doping density that may be higher than the amount of doping density in the third doped ring 656c, but less compared to the other doped ring 656e. The fourth doped ring 656d may be implanted next to the third doped ring 656c and a fifth doped ring 656e. The fifth doped ring 656e is implanted with a fifth doping density that may be higher than the amount of doping density in the other rings 656a, 656b, 656c, 656c, 656d. In the embodiment, such as that shown in FIG. 6, the doped rings may be doped with a p-type dopant. In alternative embodiments, the doped rings may be doped with an n-type dopant, the doping density may be the same in multiple rings, and/or the doping densities may alternate.

Figure 7:
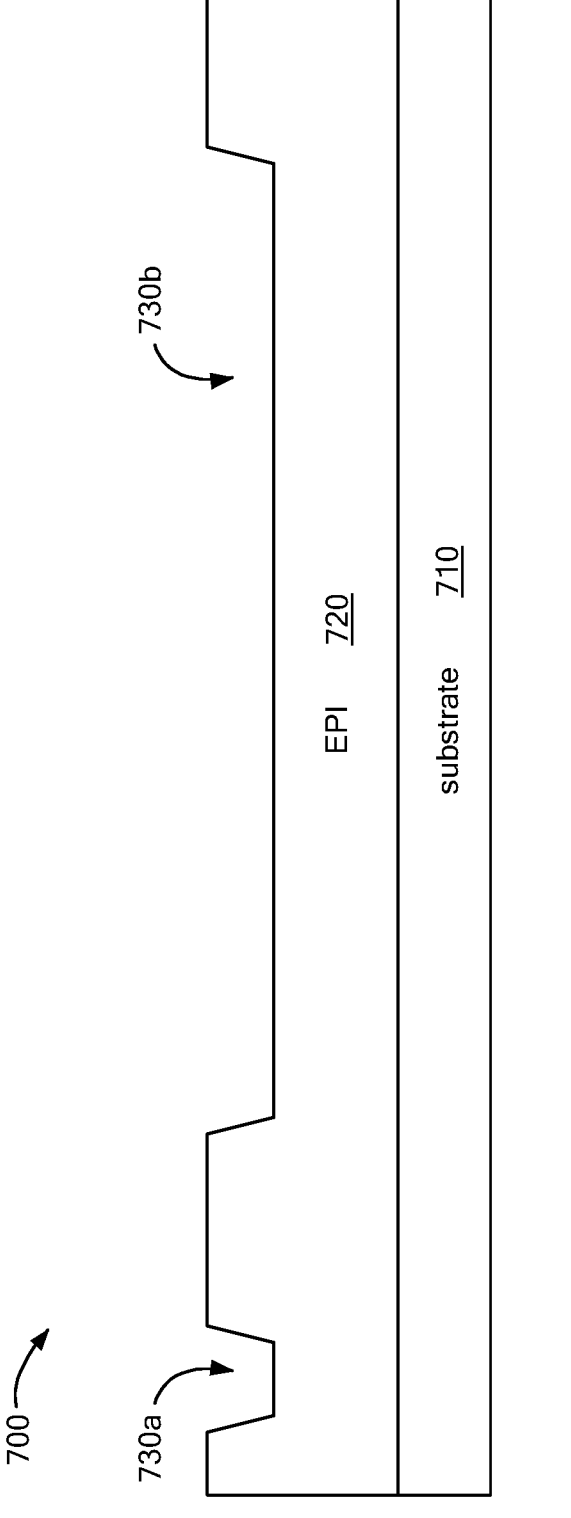
FIG. 7 is a cross-sectional view of an example of the semiconductor device of FIG. 1a during fabrication after etching to form a trench and before implantation of the doped rings.

Referring to FIG. 7, an epitaxial layer 720 is deposited on a substrate 710. The epitaxial layer 720 is etched to form trenches 730a, 730b. The substrate 710 may be n-type doped or p-type doped. The epitaxial layer 720 is doped opposite of the substrate 710. For example, if the substrate 70 is doped with a p-type dopant then the epitaxial layer 720 is doped with an n-type dopant.

The substrate 710 can be formed from a number of different semiconductor materials, such as, for example, silicon and silicon carbide. In one example, the substrate 710 and/or the epitaxial layer 720 can be formed from a crystalline semiconductor material. In some example, the crystalline semiconductor material may include but are not limited to silicon (Si), germanium (Ge), aluminum gallium nitride (AlGaN), indium gallium arsenide (InGaAs), Gallium arsenide (GaAs), indium arsenide (InAs), indium phosphide (InP), aluminum nitride (AlN), indium nitride (InN), gallium nitride (GaN), silicon carbide (SIC), and/or silicon germanium (SiGe).

In an embodiment, the substrate 710 may be a p-type doped silicon substrate with a resistivity between about 3 to 8 ohm-cm. In the same or different embodiment, the epitaxial layer 720 may be n-type doped and may be grown such that it has a thickness of between about 5 μm to 10 μm and a resistivity of about 3 to 10 ohm-cm.

A trench 730b may be used to form shallow trench isolation (STI) structures. As will be further described herein, the doped rings are implanted through the trench 730b. By implanting the doped rings after etching the trench 730b and before the trench 730b is filled with a dielectric, high-energy implantation is not needed to implant dopants through the dielectric in the trench and into the epitaxial layer thereby decreasing the risk of lattice damage.

Figures 8A, 8B:
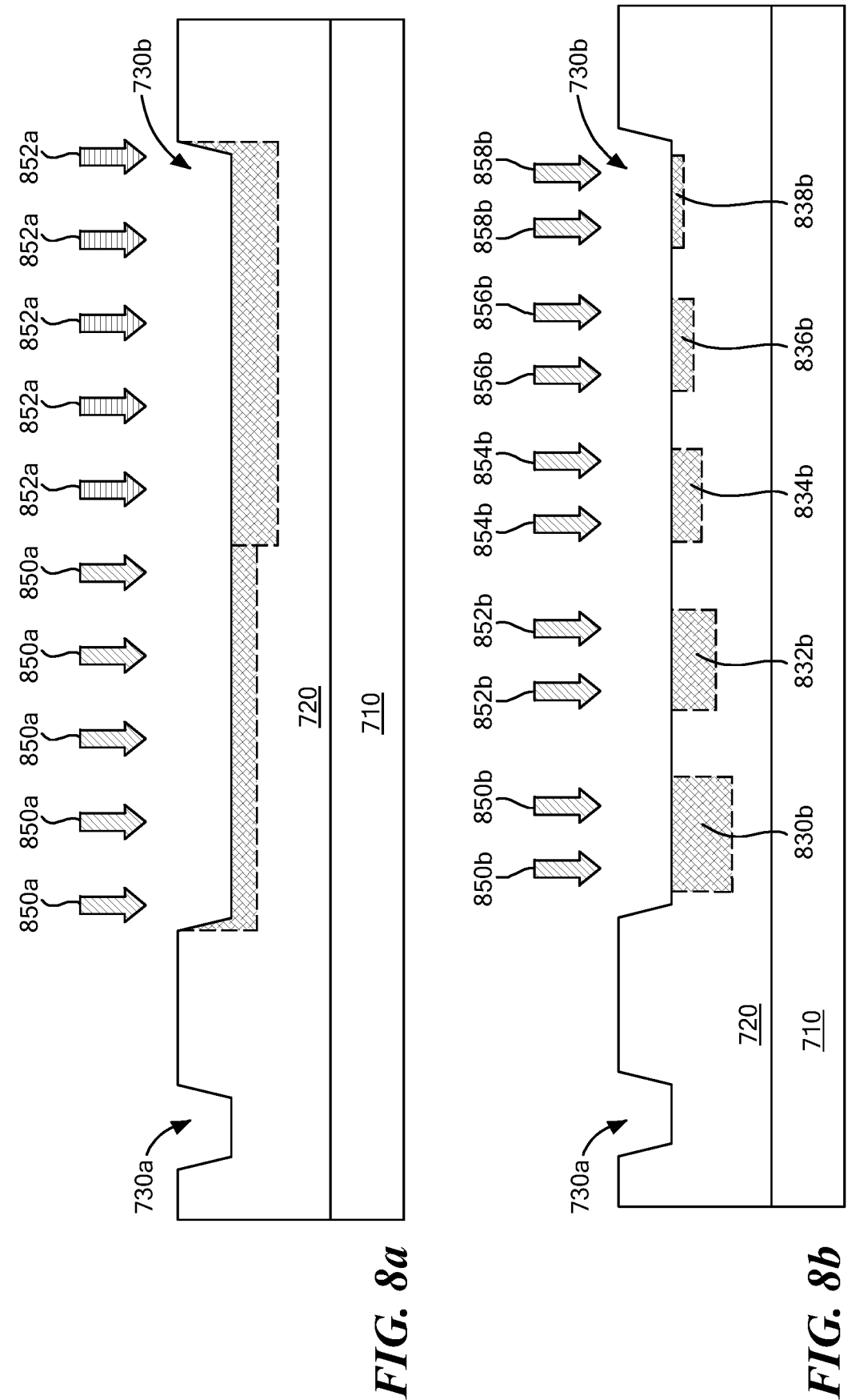
FIGS. 8a to 8d are cross-sectional views of an example of the semiconductor device of FIG. 1a during fabrication for implantations of the doped rings after the trench etching.

Referring to FIGS. 8a-8d, several types of doped rings may be implanted into the epitaxial layer 720. Referring to FIG. 8a, p-type doped rings 830a and n-type doped rings 840a may be implanted into an epitaxial layer 720 through the trench 730b. In an embodiment, the n-type doped rings 840a may be implanted in an implantations 852a at a deeper depth into the epitaxial layer 820a than the p-type doped rings 830a are implanted using an implantation 850a. The implantations 850a, 852a have both the recipes of dopants, amounts, energies, and angles to form the rings with dopants injecting through the trench 730b into the epitaxial layer 720. In other embodiments, the p-type doped rings and the n-type doped rings may be implanted at the same depth. In embodiments, the n-type doped rings 840a are implanted side-by-side and in contact with the p-type doped rings 830a or visa-versa. In other embodiments, the p-type doped rings 830a and n-type doped rings 840a may be spaced away from each other.

Referring now to FIG. 8b, multiple p-type rings may be implanted through the trench 730b into an epitaxial layer 720. In an embodiment, the p-type doped rings 830b, 832b, 834b, 836b, 838b may be implanted each with a different depth into the epitaxial layer 720 from one another.

For example, a first p-type doped ring 830b is implanted using an implantation 850b the deepest into the epitaxial layer 720. A second p-type doped ring 832b is implanted using an implantation 852b next to the first p-type doped ring 830b, but not as deep into the epitaxial layer 720 as the first p-type doped ring 830b. A third p-type doped ring 834b is implanted using an implantation 854b next to the second doped p-type ring 832b, but not as deep into the epitaxial layer 720 as the second doped p-type ring 832b. A fourth p-type doped ring 836b is implanted using an implantation 856b next to the third p-type doped ring 834b, but not as deep into the epitaxial layer 720 as the third p-type doped ring 834b. A fifth p-type doped ring 838b is implanted using an implantation 858b next to the fourth p-type doped ring 836b, but not as deep into the epitaxial layer 720 as the fourth p-type doped ring 836b. In alternative embodiments, more or less p-type rings may be used than depicted in FIG. 8b, the p-type doped rings may be implanted at the same depth or at alternating depths than depicted in FIG. 8b, and/or the p-type doped rings may be implanted deeper into the epitaxial layer 720 than depicted in FIG. 8b.

Figures 8C, 8D:
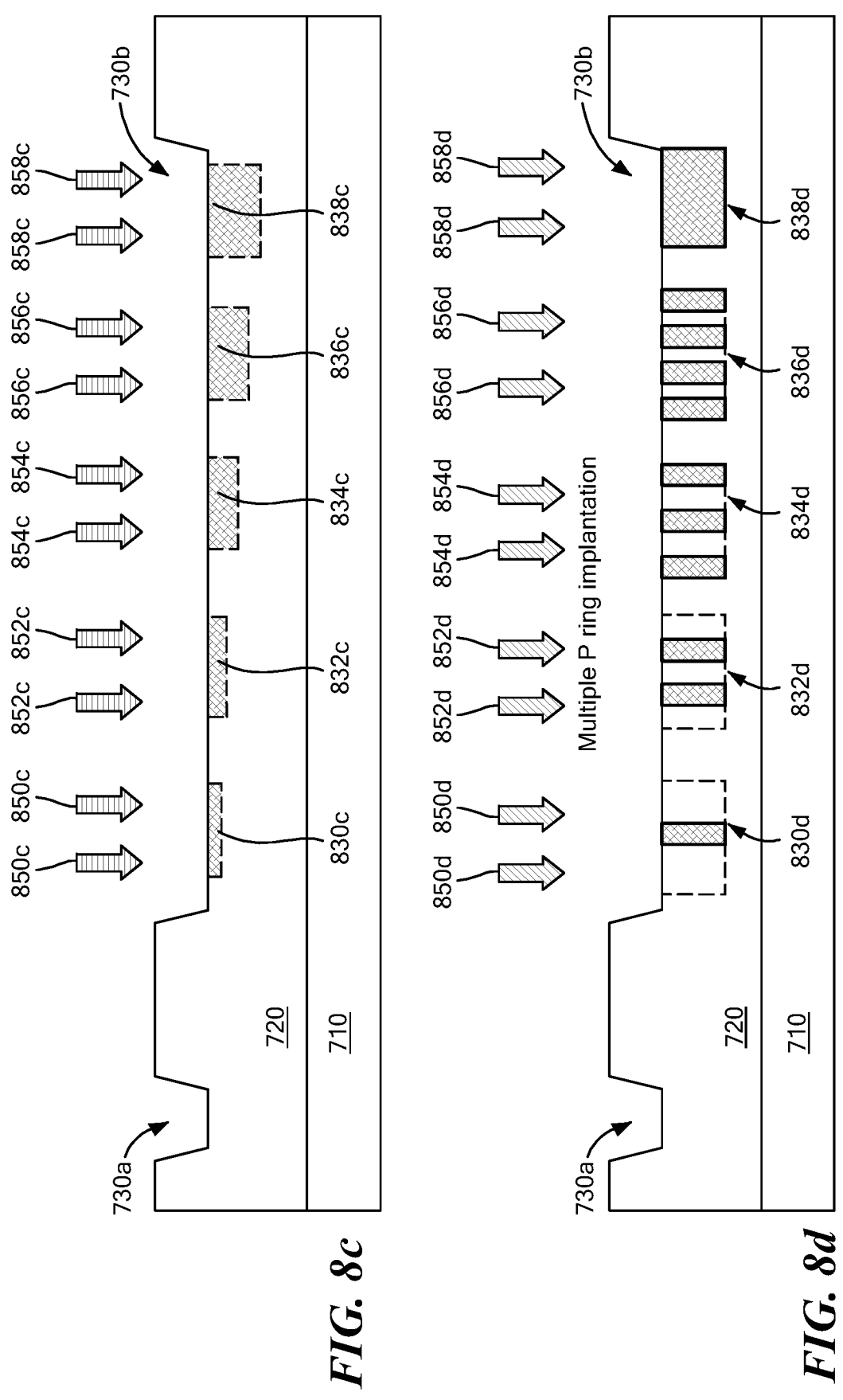

Referring to FIG. 8c, multiple n-type rings 830c, 832c, 834c, 836c, 838c may be implanted through the trench 730b into an epitaxial layer 720. Multiple n-type doped rings include the epitaxial layer 720 layered on top of the substrate 710. In an embodiment, the n-type rings deeper into the epitaxial layer 720 on one side of the device 900c compared to the other.

For example, a first n-type doped ring 830c is implanted using an implantation 850c the deepest into the epitaxial layer 720. A second n-type doped ring 832c is implanted using an implantation 852c next to the first n-type doped ring 830c, but not as shallow into the epitaxial layer 720 as the first n-type doped ring 830c. A third n-type doped ring 834c is implanted using an implantation 854c next to the second n-type doped ring 832c, but not as shallow into the epitaxial layer 720 as the second n-type doped ring 832c. A fourth n-type doped ring 836c is implanted using an implantation 856c next to the third n-type doped ring 834c, but not as shallow into the epitaxial layer 720 as the third n-type doped ring 834c. A fifth n-type doped ring 838c is implanted using an implantation 858c next to the fourth n-type doped ring 836c, but not as shallow into the epitaxial layer 720 as the fourth n-type doped ring 836c. In alternative embodiments, more or less n-type doped rings may be used than depicted in FIG. 8c, the n-type doped rings may be implanted at the same depth or at alternating depths than depicted in FIG. 8c, and/or the n-type doped rings may be implanted deeper into the epitaxial layer 720 than depicted in FIG. 8*c*.

Referring to FIG. 8*d*, multiple rings may be implanted through the trench 730*b* into the epitaxial layer 720 using the same or different implantation energy. In an embodiment, the multiple doped rings 830*d*, 832*d*, 834*d*, 836*d*, 838*d* may have different doping densities, through different amounts of doping.

The amount of doping may increase across the epitaxial layer 720. A first doped ring 830*d* is implanted using an implantation 850*d* with a first doping density that may be the lowest amount of doping density compared to the other rings 832*d*, 834*d*, 836*d*, 838*d*. A second doped ring 832*b* is implanted using an implantation 852*d* with a second doping density that may be higher than the amount of doping density in the first doped ring 830*d*, but less compared to the other doped rings 834*d*, 836*d*, 838*d*. The second doped ring 832*d* may be implanted using an implantation 852*d* next to the first doped ring 830*d* and a third doped ring 834*d*. The third doped ring 834*d* is implanted using an implantation 854*d* with a third doping density that may be higher than the amount of doping density in the second doped ring 832*d*, but less compared to the other doped rings 836*d*, 838*d*. The third doped ring 834*d* may be implanted using an implantation 854*d* next to the second doped ring 832*d* and a fourth doped ring 836*d*. The fourth doped ring 836*d* is implanted using an implantation 856*d* with a fourth doping density that may be higher than the amount of doping density in the third doped ring 834*d*, but less compared to the other ring 838*d*. The fourth doped ring 836*d* may be implanted using an implantation 56*d* next to the third doped ring 834*d* and a fifth doped ring 838*d*. The fifth doped ring 838*d* is implanted using an implantation 858*d* with a fifth doping density that may be higher than the amount of doping density in the other doped rings 830*d*, 832*d*, 834*d*, 836*d*. In the embodiment, such as that shown in FIG. 8*d*, the doping may be p-type. In alternative embodiments, the doping may be n-type, the doping density may be the same in multiple rings, and/or the doping densities may alternate.

Figures 9A, 9B:
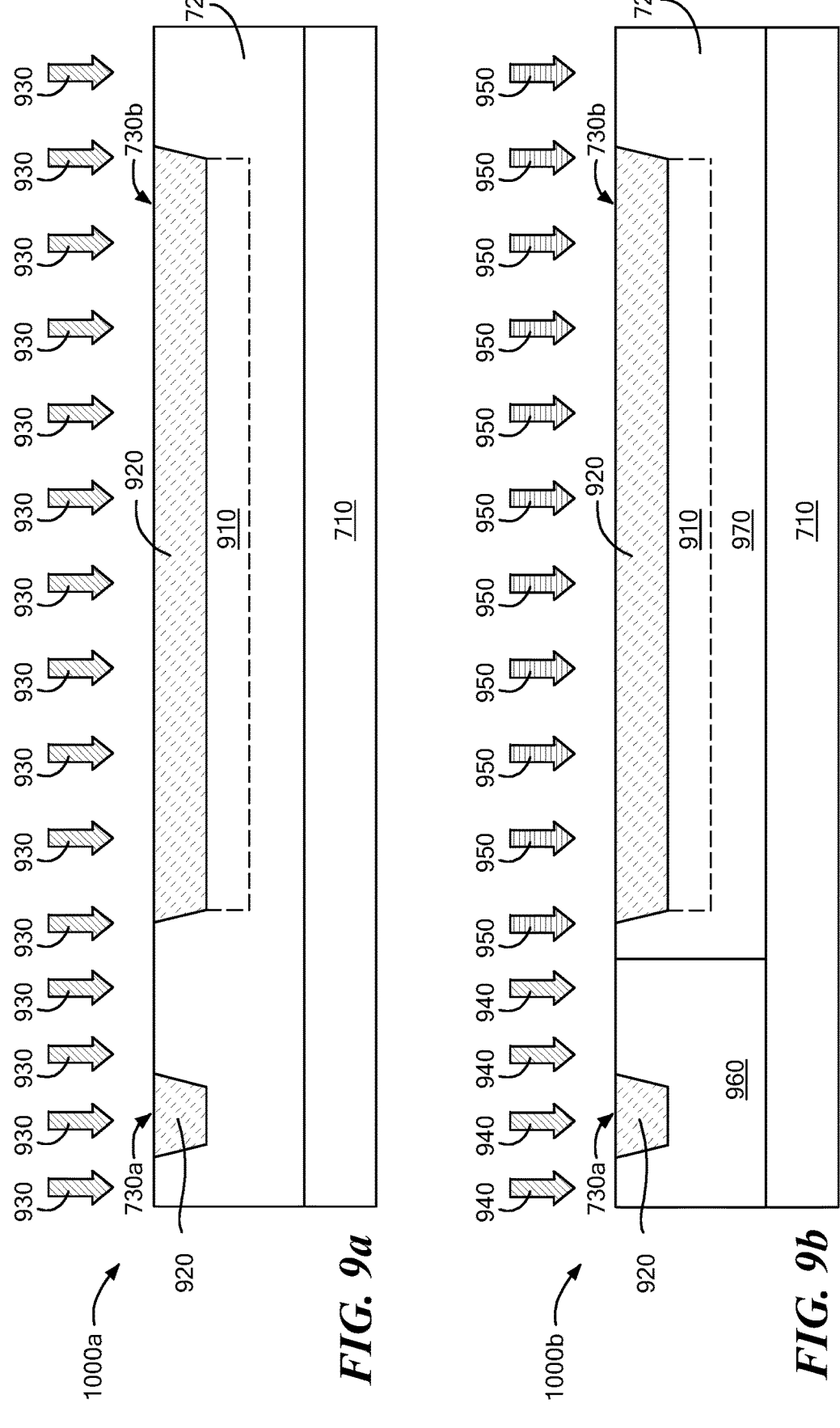
FIG. 9a is a cross-sectional view of an example of the semiconductor device of FIG. 1a after the trench is filled with dielectric material.
FIG. 9b is a cross-sectional view of an example of the semiconductor device of FIG. 1a after implantation of a well region and a drift region.
Figure 9C:
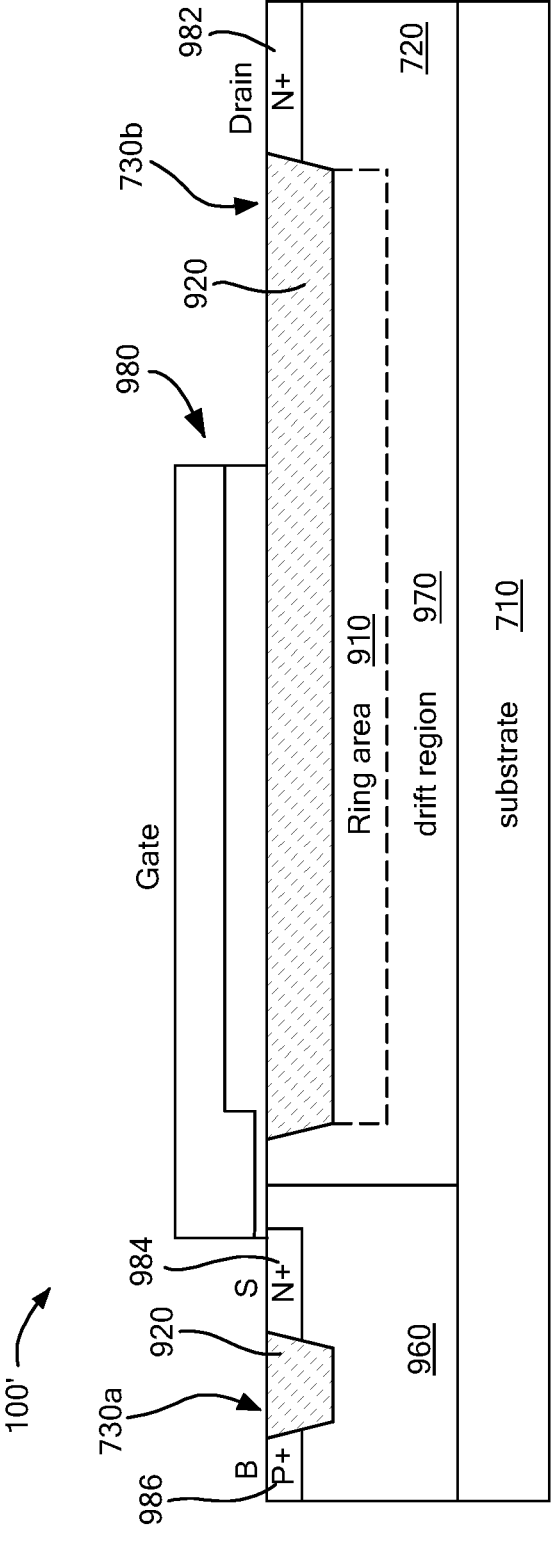
FIG. 9c is a cross-sectional view of an example of the semiconductor device of FIG. 1a after the oxide and gate structures are formed.

Referring to FIG. 9*a* to FIG. 9*c*, FIG. 9*a* shows the deposition of dielectric material, FIG. 9*b* shows the implantation of the well region and the drift region, and FIG. 9*c* shows the formation of the gate structure, drain region, source region, and body contact. In an embodiment, FIGS. 9*a* to 9*c* may occur sequentially, however FIGS. 9*a* to 9*c* may not occur sequentially or other processing steps may or may not be included.

Referring to FIG. 9*a*, the doped rings are implanted in the ring area 910. A dielectric material 920 is then deposited using a deposition process 930 into the trenches 730*a*, 730*b*. In one example, the dielectric material 920 may be tetraethyl orthosilicate (TEOS).

Referring to FIG. 9*b*, a well region 960 and a drift region 970 are implanted 940, 950 into the epitaxial layer 720. The well region 960 is formed by the implantation 940 into the epitaxial layer 720. The well region 960 may be doped with an n-type dopant or a p-type dopant. The drift region 970 is formed by the implantation 950 into the epitaxial layer 720. The drift region 970 may be doped with an n-type dopant or a p-type dopant.

Referring to FIG. 9*c*, an example of the semiconductor device 100 is a semiconductor device 100'. The semiconductor device 100' includes a gate structure 980 formed using traditional fabrication techniques. The gate structure 980 is formed on top of a source region 984, the well region 960, the drift region 970, and the dielectric material 920. A drain region 982 is implanted in the drift region 970 next to the trench 730*b* that is filled with dielectric material 920. The drain region 982 is heavily doped with either an n-type dopant or a p-type dopant. The source region 984 and a body region 986 are implanted on either side of the trench 730*a* that is filled with dielectric material 920. The source region 984 and the body region 986 are heavily doped with either an n-type dopant or a p-type dopant.

Figure 10:
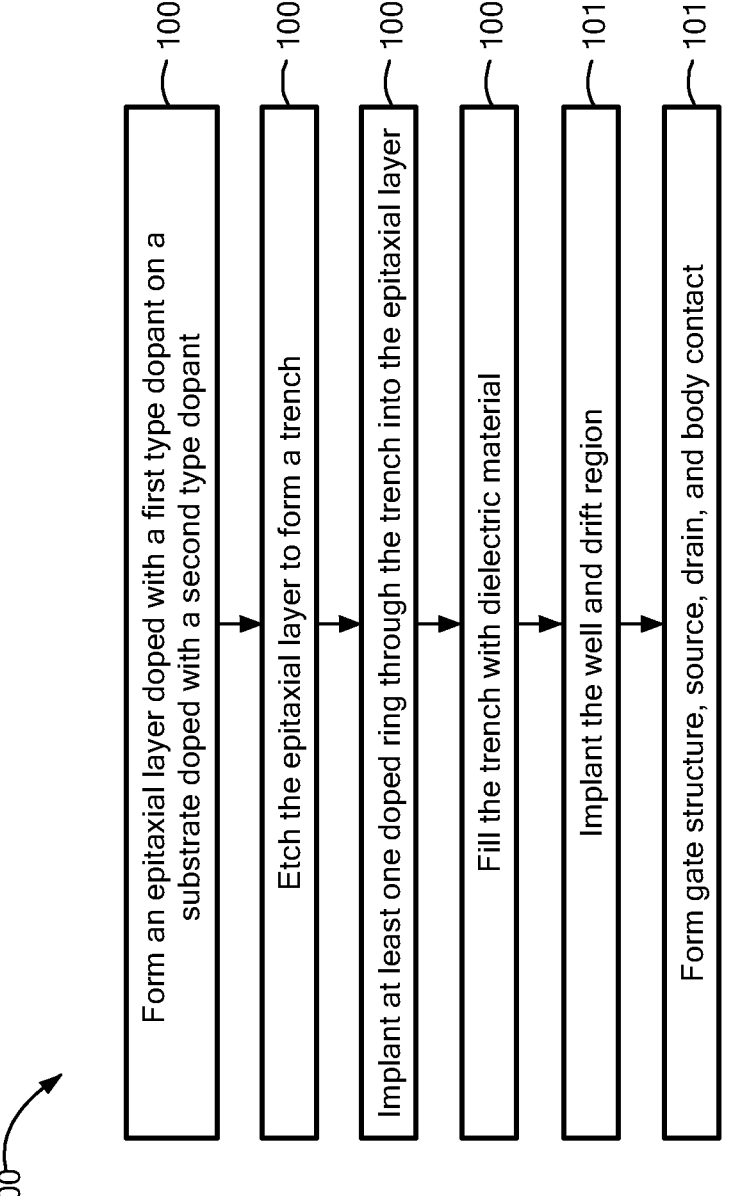
FIG. 10 is a flowchart of an example of a process to fabricate the semiconductor device with doped rings.

Referring to FIG. 10, an example of a process to form a semiconductor device with implanted rings is a process 1000. For example, the process 1000 may be used to form any of the semiconductor devices described herein that include implanted rings such as, for example, semiconductor devices 100, 200, 300, 400, 500, 600.

Process 1000 forms an epitaxial layer doped with a first type dopant on a substrate doped with a second type dopant (1002). For example, the epitaxial layer 720 is deposited on the substrate 710 (FIG. 7).

Process 1000 etches the epitaxial layer to form a trench for dielectric deposition (1004). For example, the epitaxial layer 720 is etched using dry etching or wet etching techniques to form a trench 730*b* (FIG. 7).

Process 1000 implants at least one doped ring through the trench into the epitaxial layer (1006). For example, a ring 830*a* is implanted through the trench 730*b* int the epitaxial layer 720 (FIG. 8*a*)

Process 1000 fills the trench with a dielectric material (1008). For example, the trench 730*b* is filled with a dielectric material 920 (FIG. 9*a*).

Process 1000 implants a well and a drift region (1010). For example, a well region 960 and a drift region 970 are formed (FIG. 9*b*).

Process 1000 forms a gate structure, drain region, source region, and body contact (1012). For example, the gate structure 980, drain region 982, source region 984, and body contact 986 are formed (FIG. 9*c*).

Figure 11:
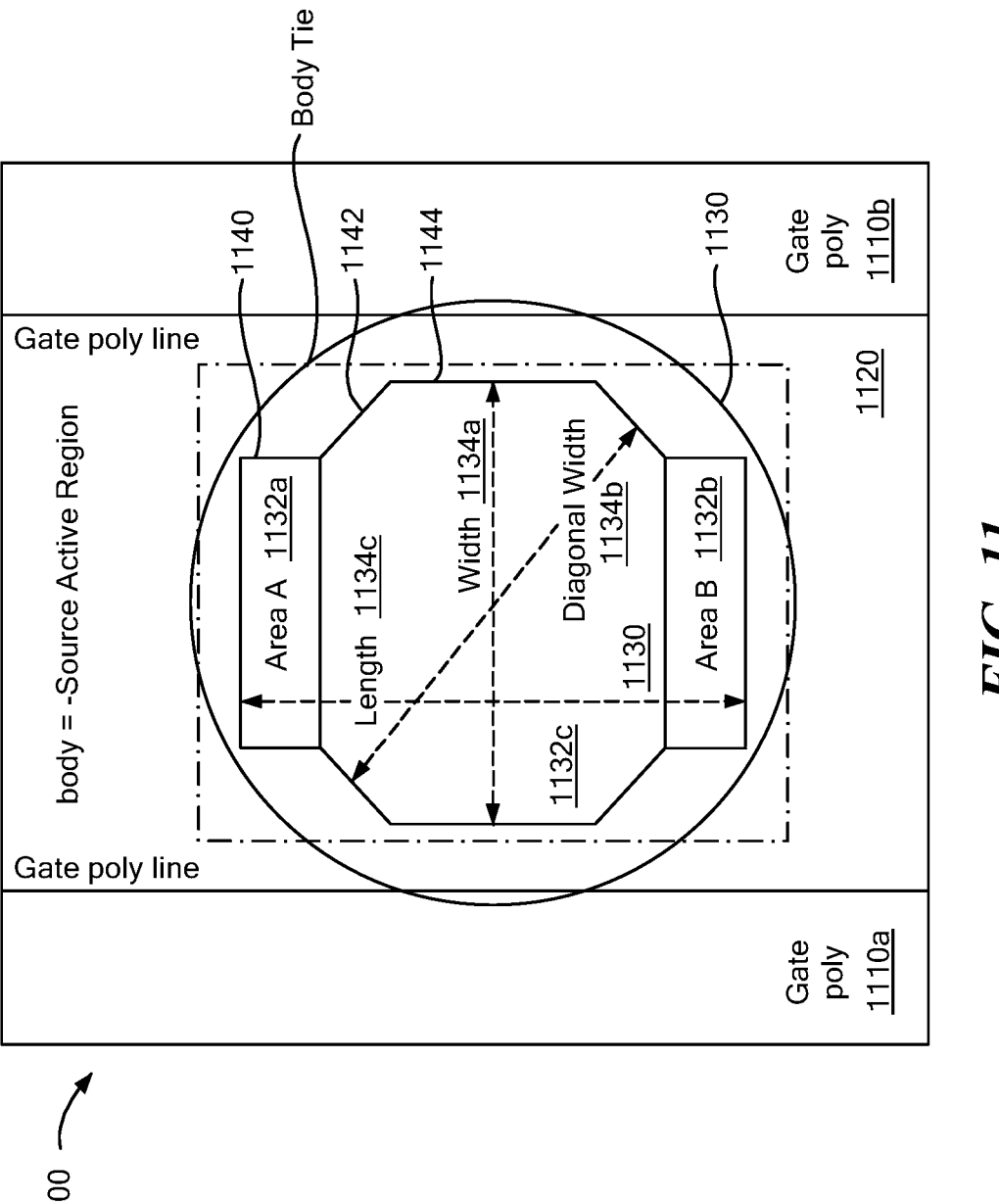

Referring to FIG. 11, another example of the body tie 140 semiconductor device 100 is a twelve-sided body tie 1100. The twelve-sided body tie 1100 is made up of a gate structure 1110*a*, 1110*b* and a body region 1120. The body region 1120 is the source active region. A body tie 1130 is situated inside of the body region 1120. The body tie 1130 is made up of various regions 1132*a*, 1132*b*, 1132*c*, which give the body tie 1130 its twelve-sided shape. These regions include an area A 1132*a*, an area B 1132*b*, and a center area 1132*c*. A length 1134*c* is measured from area A 1132*a* to area B 1132*b*. The center area 1132*c* can be measured in multiple ways, the center area 1132*c* has a width 1134*a* and a diagonal width 1134*b*.

The twelve-sided shape is formed from a scalene octagon and two elongated rectangles. The sides of body tie 1130 are not equal to each other giving it its twelve-sided shape. The scalene octagon is depicted as the center area 1132*c*, wherein the scalene octagon has four 45-degree peripheral edges. The elongated rectangle is depicted by area A 1132*a* and area B 1232*b*. The area of the body tie refers to the combination of the area of the center area 1132*c*, the area A 1132*a*, and the area B 1132*b*.

The unique shape of the twelve-sided body tie 1130 provides a better tradeoff of the layout requirements, layout factors, and/or processing factors. The challenges associated with the manufacturing of the overall device and the body tie leads to minimal width and area requirements, as well as spacing requirements in relation to the gate. The required spacing of the gate 1110*a*, 1110*b* to the body tie 1130 affects the width of the source. The twelve-sided shape improves the contact area efficiency, obtains a smaller source width and smaller specific on state resistance, maintains good effective channel width and sustains a wider process toler-ance. The center area 1132*c* of the body contact does not touch the gate 1110*a*, 1110*b*, which means the source still exists between the body contact and the gate 1110*a*, 1110*b*. This is one way to maintain the effective device channel width. The body tie is important for safe operations area ("SOA") and prevents false turn on of parasitic N-type-P-type-N-type ("NPN") in N-type-Metal-Oxide-Semiconduc-tor ("NMOS") due to the body resistance from body tie to body-drift region. False turn on of a parasitic NPN means the parasitic NPN BJT is turned on, leading the DMOS to be out of control.

The twelve-sided body tie shape allows for a better adaptivity for the photoresist process in the fabrication. A contour 1140, 1142, 1144 is formed in the side along the outside of the area A 1132*a* and area B 1132*b*. The contour refers to the outside area along the body tie 1130, where an upper side 1140 of area a 1132*a* and a middle side 1142 and a lower side 1144 of the center area 1132*c* meet. The contour of the twelve-sided body tie enhances the body tie such that it is able to endure a larger mechanical force and sustain a wider process tolerance. The elongated rectangle adds on an additional area to assist in meeting the minimal area rule and to enhance the rigidness of the photoresist islands in the photolithography process. The contour reduces the channel pitch (2.4% for low voltage DMOS ("dmoslv") and improves the specific on-resistance ("Ronsp"), a factor to source-to-drain resistance. Further, the contour increases the effective channel width and improves the Rw. Rw is the source-to-drain on-resistance timing the channel width. Rw eliminates the influence of the channel width on the on-resistance, which is used to check MOSFET performance.

The minimal width and the minimal area rule of a single layout structure indicates the minimal width and spacing of or in between any mask layer or any layer that can be processed during fabrication. Through the minimal area rule of the heavily n-type doping ("nplus") or heavily p-type doping ("pplus") mask, the area is usually significantly larger than the square of the minimal width in the technology nodes. For instance, the minimal area of 0.29 um$^2$ is 81% larger than the 0.16 um$^2$ for the minimal width of 0.4 um in a 180 nm technology (SG8). The elongated rectangle adds extra area to meet the minimal area rule and enhances the rigidness of the photoresist islands in the photolithographic process.

In an embodiment, the manufacturing of the twelve-sided body tie includes the following rules: minimal p+ width: minimum width of a PPLUS layer ("wipp"); minimal p+ area: minimum area of a pplus layer ("mapp"); wipp*wipp<mapp; minimal width is checked in the hori-zontal, vertical or 45-degree diagonal directions.

In an additional embodiment, the manufacturing of the twelve-sided body tie includes the following rules that may be followed: minimal p+/n+ width: wipp, winp; minimal p+/n+ area: mapp, manp; minimal width is checked in the horizontal, vertical and/or 45-degree diagonal directions. In this embodiment, the wipp*wipp<mapp, the actual pplus width is much larger than wipp in alternative forms, such as the rectangles and scalene octagon listed in Table 1.

In an additional embodiment with 180 nm technology, the manufacturing of the twelve-sided body tie includes the following rules: wipp=0.4; mapp=0.29; 0.4*0.4=0.16<0.29 by 81%; this mapp rule requires a 0.538 square box to produce: 0.538=135%*0.4 (wipp) in alternative shapes such as those with a rectangular body tie.

TABLE 1

A comparison of examples with this 180 nm technology using the twelve-sided body tie and prior art body tie in various aspects.

| | Twelve-Sided Body Tie | Prior Art - Rectangles | Prior Art - Scalene Octagon |
|---|---|---|---|
| Body Tie length | 0.58 | 0.725 | 0.68 |
| Diagonal length | 0.523 | 0.828 | 0.551 |
| Channel width reduction | 0.16 | 0.4 | 0.1 |
| Effective channel width ratio | Good (91%) | Reduced (78%) | Good (94%) |
| Body-source active length | shorter (0.64) | longer (0.73) | longer (0.74) |

Referring to Table 1, a comparison of examples of body ties including an example with a twelve-sided body tie, a prior art example with a rectangular body tie, and a prior art example with a scalene octagon body tie. The channel width refers to the effective source width, with an overlap of the nplus mask and gate polysilicon (in the y-direction). The unit width of the body tie and source is 1.76 um (in the y-direction). The body tie length refers to the maximum body tie length (in the x-direction). The channel reduction refers to the reduction in channel width due to the narrow nplus source in the active region, which is mostly occupied by the pplus mask. The effective channel width ratio refers to the ratio of nplus mask width over unit width=100%−"channel width reduction"/"unit width". For example, 100%−0/16/1.76=91%. Body-source active length refers to the active length of the body-tie and source region (in the x-direction). Based on the above, the example with the twelve-sided body tie has a good effective channel width ratio and a shorter body-source active length, which can give a smaller pitch.

The processes described herein are not limited to the specific examples described. For example, the process 700 is not limited to the specific processing order of FIG. 7. Rather, any of the processing blocks of FIG. 7 may be re-ordered, combined, or removed, performed in parallel or in serial, as necessary, to achieve the results set forth above.

Although reference is made herein to particular materials, it is appreciated that other materials having similar func-tional and/or structural properties may be substituted where appropriate, and that a person having ordinary skill in the art would understand how to select such materials and incor-porate them into embodiments of the concepts, techniques, and structures set forth herein without deviating from the scope of those teachings.

Although the disclosed subject matter has been described and illustrated in the foregoing exemplary embodiments, it is understood that the present disclosure has been made only by way of example, and that numerous changes in the details of implantation of the disclosed subject matter may be made without departing from the spirit and scope of the disclosed subject matter.

What is claimed is:

1. A semiconductor device, comprising:
   a substrate having a first type dopant;
   an epitaxial layer above the substrate, having a second type dopant and a top region;
   a body tie in the epitaxial layer, wherein the body tie has a plurality of sides not equal to each other;
   a trench in the top region of the epitaxial layer;
   at least one doped ring implanted in the epitaxial layer below the trench; and
   a dielectric material filling within the trench.

2. The semiconductor device of claim 1, further comprising an oxide and a gate structure on the dielectric material and the epitaxial layer.

3. The semiconductor device of claim 1, wherein the at least one doped ring comprises at least two doped rings having different doping densities from each other.

4. The semiconductor device of claim 1, wherein the at least one doped ring is a n-type ring.

5. The semiconductor device of claim 1, wherein the at least one doped ring is a p-type ring.

6. The semiconductor device of claim 1, wherein the first type dopant is a p-type dopant and wherein the second type dopant is a n-type dopant.

7. The semiconductor device of claim 1, wherein the at least one doped ring comprises at least one doped ring with a n-type dopant and at least doped ring with a p-type dopant.

8. The semiconductor device of claim 1, wherein the substrate and/or the epitaxial layer comprise a crystalline semiconductor material.

9. The semiconductor device of claim 8, wherein the crystalline semiconductor material comprises at least one of Si, Ge, AlGaN, InGaAs, GaAs, InAs, InP, AlN, InN, GaN, SiC, and/or SiGe.

10. The semiconductor device of claim 1, wherein the body tie is twelve-sided and formed from a scalene octagon and two elongated rectangles.

11. The semiconductor device of claim 1, wherein the at least one doped ring comprises at least two doped rings implanted at different depths in the epitaxial layer.

12. A semiconductor device, comprising:

a substrate having a first type dopant;

an epitaxial layer above the substrate, having a second type dopant and a top region;

a twelve-sided body tie in the epitaxial layer, wherein sides of the twelve-sided body tie are not all equal to each other;

a trench in the top region of the epitaxial layer;

at least one doped ring implanted in the epitaxial layer below the trench;

a dielectric material filling within the trench; and an oxide and a gate structure on the dielectric material.

13. The semiconductor device of claim 12, wherein the twelve-sided body tie has a width of 0.58 μm.

14. The semiconductor device of claim 12, wherein the twelve-sided body tie has a diagonal width of 0.523 μm.

15. The semiconductor device of claim 12, wherein the at least one doped ring has different doping densities.

16. The semiconductor device of claim 12, wherein the at least one doped ring is n-type and/or p-type.

17. The semiconductor device of claim 12, wherein the first type dopant is a p-type dopant and wherein the second type dopant is a n-type dopant.

18. A semiconductor device, comprising:

a substrate having a first type dopant;

an epitaxial layer above the substrate, having a second type dopant and a top region;

a twelve-sided body tie in the epitaxial layer, wherein sides of the twelve-sided body tie are not all equal to each other;

a dielectric material filling; and an oxide and a gate structure on top of the epitaxial layer.

19. The semiconductor device of claim 18, wherein the twelve-sided body tie has a width of 0.58 μm.

20. The semiconductor device of claim 18, wherein the twelve-sided body tie has a diagonal width of 0.523 μm.

21. The semiconductor device of claim 18, wherein the first type dopant is a p-type dopant and wherein the second type dopant is a n-type dopant.

* * * * *